(12) United States Patent
Naderi

(10) Patent No.: US 8,907,829 B1
(45) Date of Patent: Dec. 9, 2014

(54) SYSTEMS AND METHODS FOR SAMPLING IN AN INPUT NETWORK OF A DELTA-SIGMA MODULATOR

(71) Applicant: Cirrus Logic, Inc., Austin, TX (US)

(72) Inventor: Ali Naderi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/896,526

(22) Filed: May 17, 2013

(51) Int. Cl.
*H03M 3/00* (2006.01)
*H03M 1/12* (2006.01)
*H03M 1/80* (2006.01)
*H03M 1/00* (2006.01)

(52) U.S. Cl.
CPC . *H03M 3/50* (2013.01); *H03M 1/12* (2013.01); *H03M 3/30* (2013.01); *H03M 1/804* (2013.01); *H03M 1/00* (2013.01)
USPC ............................................ 341/143; 341/155

(58) Field of Classification Search
CPC ........... H03M 3/30; H03M 1/00; H03M 1/12; H03M 1/804
USPC .......................... 341/143, 155, 156, 172, 150
See application file for complete search history.

(56) References Cited

U.S. PATENT DOCUMENTS

2009/0140899 A1* 6/2009 Ceballos et al. .............. 341/143

OTHER PUBLICATIONS

D. Senderowicz et al., "Low-Voltage Double-Sampled Delta-Sigma Converters," IEEE J. Solid-State Circuits, vol. 37, pp. 1215-1225, Dec. 1997, 13 pages.
P.J. Hurst and K.C. Dyer, "An improved double sampling scheme for switched-capacitor delta-sigma modulators," IEEE Int. Symp. Circuits Systems, May 1992, vol. 3, pp. 1179-1182, 4 pages.

* cited by examiner

*Primary Examiner* — Joseph Lauture
(74) *Attorney, Agent, or Firm* — Jackson Walker L.L.P.

(57) ABSTRACT

In accordance with systems and methods of the present disclosure, an input network for a delta-sigma modulator having at least one integrator stage and a feedback digital-to-analog stage, may be configured to, during a first period of a first phase of a clock signal, drive an analog feedback signal proportional to a digital feedback signal of the feedback digital-to-analog stage onto an input plate of a sampling capacitor integral to the input network. The input network may further be configured to, during a second period of the first phase of the clock signal, sample an analog input signal onto the input plates of the sampling capacitor.

12 Claims, 5 Drawing Sheets

SYSTEMS AND METHODS FOR SAMPLING IN AN INPUT NETWORK OF A DELTA-SIGMA MODULATOR

FIELD OF DISCLOSURE

The present disclosure relates in general to the field of electronics, and more specifically to systems and methods for double sampling in an input network of a delta-sigma modulator.

BACKGROUND

Delta-sigma modulators are particularly useful in digital-to-analog and analog-to-digital converters (DACs and ADCs). Using oversampling, a delta-sigma modulator spreads the quantization noise power across an oversampling frequency band, which is typically much greater than the input signal bandwidth. Additionally, the delta-sigma modulator performs noise shaping by acting as a low-pass filter to the input signal and a high-pass filter to the noise; hence, most of the quantization noise power is thereby shifted out of the signal band.

The typical delta-sigma modulator includes a summer summing the input signal with negative feedback, a linear filter, quantizer and a feedback loop with a digital-to-analog converter coupling the quantizer output and the inverting input of the summer. In a first order modulator, the linear filter comprises a single integrator stage while the filter in a higher order modulator comprises a cascade of a corresponding number of integrator stages. The quantizer can be either a one-bit or a multiple-bit quantizer. Higher-order modulators have improved quantization noise transfer characteristics over those of lower order, but stability becomes a more critical design factor as the order increases.

Switched-capacitor filters/integrators are useful in a number of applications including the integrator stages in delta-sigma modulators. Generally, a basic differential switched-capacitor integrator samples the input signal, and often a reference voltage as well, onto a corresponding pair of sampling capacitors during the sampling (charging) phase, in a process sometimes referred to as "double sampling." During the following second phase, the charge on the sampling capacitor is transferred at the summing nodes of an operational amplifier to a corresponding pair of integrator capacitors in the amplifier feedback loops. The operational amplifier drives the integrator output. An example input network 100 for a delta-sigma modulator is depicted in FIG. 1.

Example input network 100 of FIG. 1 generally operates in accordance with a clock signal CLK, the complement of which is a signal CLK'. Each of clock signals CLK and CLK' may comprise a square-wave signal, as shown in FIG. 1. Clock signals CLK and CLK' may define clock cycles operating at a sampling rate wherein each clock cycle includes a first phase when clock signal CLK is high and clock signal CLK' is low and a second phase when clock signal CLK is low and clock signal CLK' is high. Generally, during the first phase of each cycle, switches 102 and 108 close and charges proportional to the voltages $v^+$ and $v-$ at the inputs to input network 100 are respectively sampled onto cross-coupled sampling capacitors 110a and 110b, respectively. During the second phase of each cycle, switches 104 and 106 close, and the input voltages $v^+$ and $v-$ are coupled to the input plates of sampling capacitors 110a and 110b, respectively. Consequently the charges sampled onto sampling capacitors 110a and 110b during the first phase are respectively forced onto integration capacitors 114a and 114b which are each coupled between inputs and outputs of an integrator 112.

Differential double sampling is often advantageous as it increases signal-to-noise ratios as compared to single-ended sampling because the effective signal input is doubled. In addition, differential double sampling effectively doubles the sampling rate, relaxing requirements for anti-aliasing filtering of the input network 100. However, differential double sampling effectively reduces the input impedance present at the input of input network 100 as compared to single-ended sampling. The low input-impedance results in an increase in total harmonic distortion (THD) due to an anti-aliasing filter present at the input of input network 100 (not explicitly shown in FIG. 1). The signal-dependent charge injected in the network 100 ultimately returns to the anti-alias filter, and because input-impedance of the network 100 is lower than that of its single sampling counterpart, it creates larger voltage over a resistor of the anti-alias filter, resulting in the signal distortion. Therefore, the low input impedance may undesirably load the anti-aliasing filter, cause loss, and also cause undesired harmonic distortion in the input differential signal.

Accordingly, to reduce such disadvantages, it may be desirable to increase effective impedance of the input network of a delta-sigma modulator when double sampling is employed. A number of solutions to provide for such increased impedance have been proposed, but such solutions have shortcomings and disadvantages.

For example, in one solution, a buffer is used which, during a portion at the beginning of the sampling phase, each polarity of the differential input signal is used to pre-charge sampling capacitors (e.g., capacitors 110a and 110b) of the input network, after which the sampling phase continues and inputs are sampled similarly to that described above. However, such an approach requires high-bandwidth and power-hungry buffers if active buffers are used, and a high-bandwidth analog front end if passive buffers are used. In addition, input impedance increases based on a gain of the buffers, thus increasing risk of signal distortion.

In another solution, during a portion of the beginning of the sampling phase, sampling capacitors (e.g., capacitors 110a and 110b) are discharged to a common-mode voltage equal to $(v^+ + v^+)/2$. However, such an approach only leads to a doubling of the effective input impedance.

Hence, for applications requiring delta-sigma modulation, improved techniques for increasing of the input impedance at the input sampling network, are desired.

SUMMARY

In accordance with the teachings of the present disclosure, certain disadvantages and problems associated with sampling input signals for a delta-sigma modulator may be reduced or eliminated.

In accordance with embodiments of the present disclosure, an input network for a delta-sigma modulator having at least one integrator stage and a feedback digital-to-analog stage, may be configured to, during a first period of a first phase of a clock signal, drive an analog feedback signal proportional to a digital feedback signal of the feedback digital-to-analog stage onto an input plate of a sampling capacitor integral to the input network. The input network may further be configured to, during a second period of the first phase of the clock signal, sample an analog input signal onto the input plates of the sampling capacitor.

In accordance with these and other embodiments of the present disclosure, a method may comprise driving an analog feedback signal proportional to a digital feedback signal of a feedback digital-to-analog stage of a delta-sigma converter onto an input plate of the sampling capacitor during a first period of a first phase of a clock signal, wherein the sampling capacitor is integral to an input sampling network for the delta-sigma converter. The method may also comprise sampling an analog input signal onto the input plates of the sampling capacitor during a second period of the first phase of the clock signal.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 2:
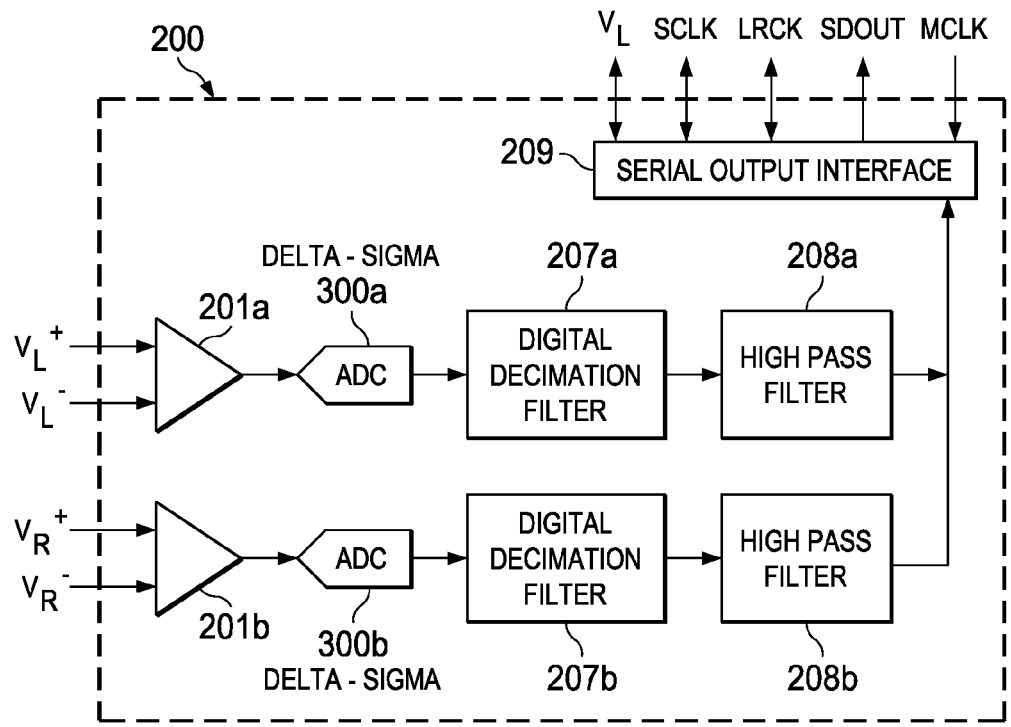
FIG. 2 illustrates a high-level block diagram of an analog-to-digital converter, in accordance with embodiments of the present disclosure.

FIG. 2 illustrates a high-level block diagram of an analog-to-digital converter 200, in accordance with embodiments of the present disclosure. Analog-to-digital converter 200 is only one of a number of possible applications that may employ delta-sigma data modulators. Other examples include digital-to-analog converters and coder-decoders (codecs).

Analog-to-digital converter 200 may include two conversion paths for converting left and right channel analog audio data respectively received at left and right analog differential inputs $v_L^+/v_L^-$ and $v_R^+/v_R^-$. The analog input signals may be respectively passed through input gain stages 201a and 201b and then to delta-sigma analog-to-digital converters (ADCs) 300a and 300b, which are described in greater detail with respect to FIG. 3, below. The digital outputs of delta-sigma ADCs 300a and 300b may be passed through corresponding decimation filters 207a and 207b, which may reduce the sample rate, and high-pass filters 208a and 208b which may filter out high-frequency harmonic noise from the respective digital signals. Delta-sigma ADCs 300a and 300b may sample the analog-signal at an oversampling rate and output digital data, in either single-bit or multiple-bit form depending on the quantization, at the oversampling rate. The resulting quantization noise is shaped and generally shifted to frequencies above the audio band.

The resulting left and right channel digital audio data may be output through a single serial port SDOUT of a serial output interface 209, timed with serial clock SCLK and left-right clock LRCK in accordance with the Digital Interface Format (DIF). The SCLK and LRCK clocks can be generated externally and input to converter 200 or can be generated on-chip, along with the associated data, in response to a received master clock MCLK.

Figure 3:
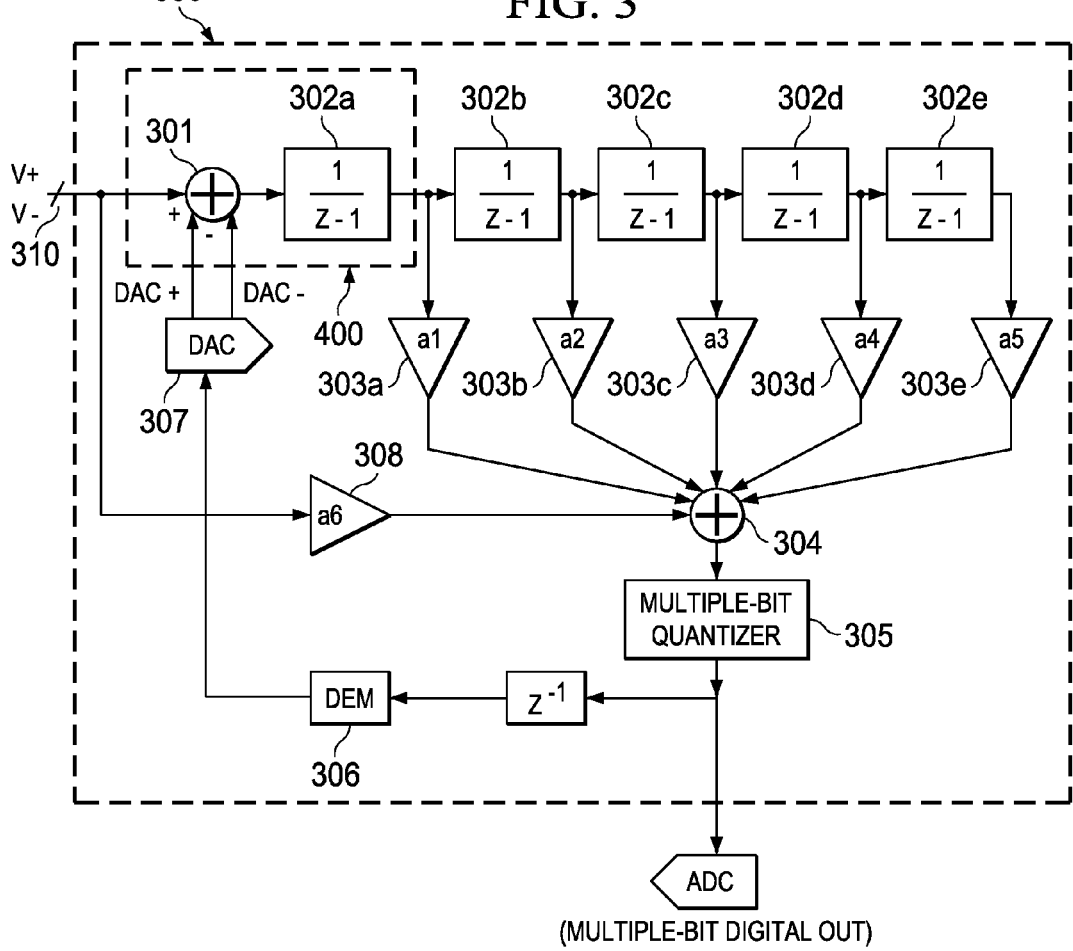
FIG. 3 illustrates a block diagram of an example delta-sigma feedforward modulator, in accordance with embodiments of the present disclosure.

FIG. 3 illustrates a block diagram of an example delta-sigma feed-forward modulator 300, in accordance with embodiments of the present disclosure. Modulator 300 may be a suitable modulator that may be used as or part of either or both of delta-sigma ADCs 300a and 300b depicted in FIG. 2. Delta-sigma modulator 300 may include an input summer 301 and one or more integrator stages 302. Although any suitable number of integrator stages may be used, in the embodiments represented by FIG. 3, delta-sigma modulator 300 includes five integrator stages 302a-302e, and thus delta-sigma modulator 300 depicted in FIG. 3 is a fifth-order delta-sigma modulator. Delta-sigma modulator 300 may include a weighted feed-forward design in which the outputs of each of the integrator stages may be passed through a respective gain stage (amplifier) 303 (e.g., 303a-303e) to an output summer 304. Amplifiers 303 may allow the outputs of the integrator stages to be weighted at the input of summer 304. The output from summer 304 may be quantized by a multiple-bit quantizer 305, which may generate a multiple-bit digital output signal labeled as ADC in FIG. 3. Additionally, the output from quantizer 305 may be fed back to the inverting input of summer 301 through dynamic element matching (DEM) circuitry 306 and multiple-bit digital-to-analog converter (DAC) 307.

FIG. 3 also depicts an additional feed-forward path, including amplifier 308, between modulator input 310 and summer 304. The gain of amplifier stage 308 may be given by the equation gain=(1/Quantizer gain)(1/Multi-Bit DAC gain). The purpose of this additional feed-forward path is to cancel as much of the input signal energy from the delta-sigma loop as possible. Consequently, most of the voltage swing within the modulator may be quantization noise. In turn, the design constraints on the sub-circuits within modulator 300 may be relaxed. For example, the first integrator stage 302a is typically the major contributor to the noise performance of the entire modulator. This feed-forward technique results in less signal energy at the outputs of the integrator stages, and hence such parameters as the stage operation amplifier (opamp) DC gain may be reduced. In turn, the power consumption of the device as well as the die size may be reduced.

A fifth-order feed-forward design was selected for discussion purposes; in actual implementation, the order as well as the configuration of the modulator may vary.

Figure 4A:
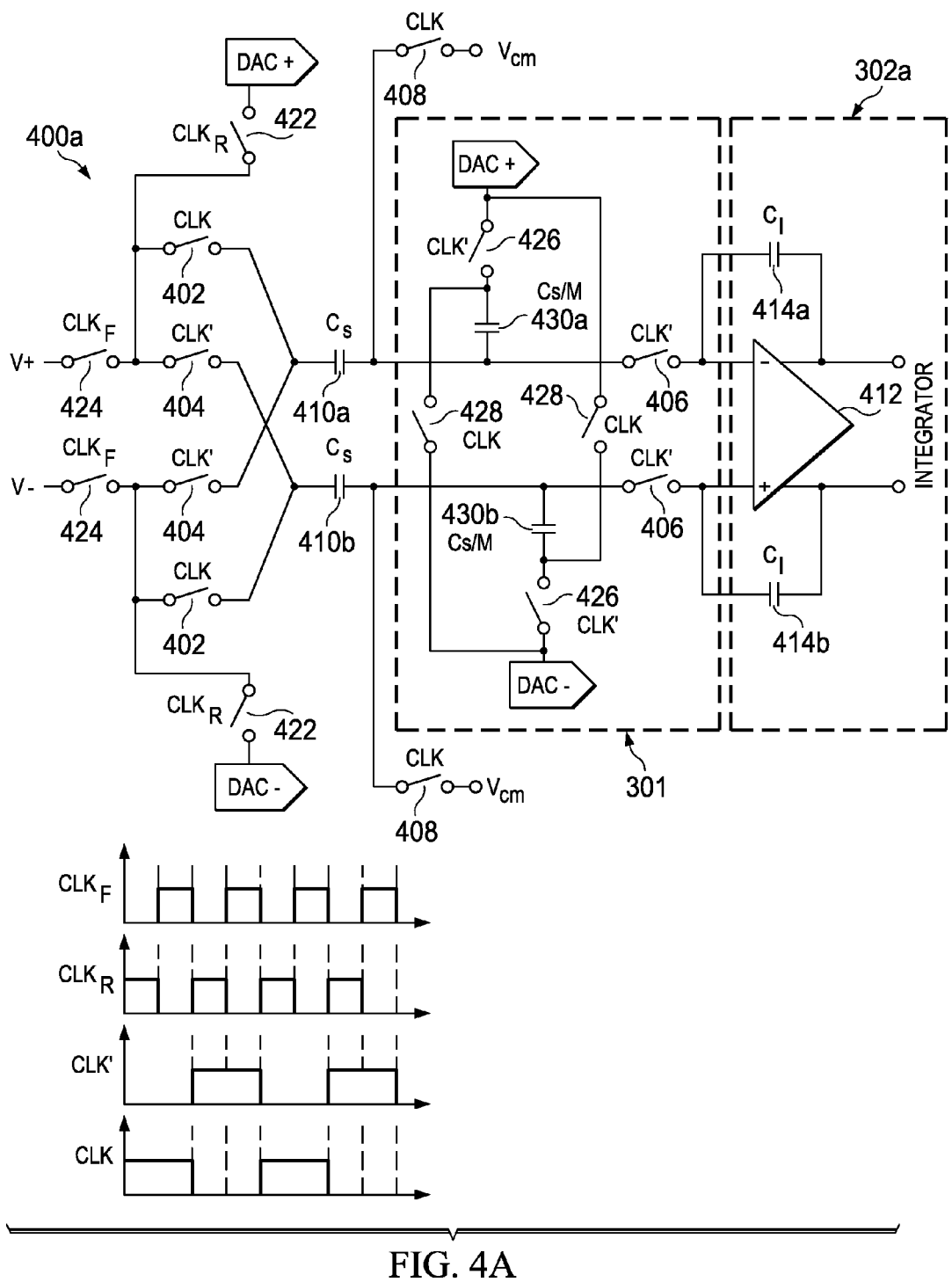
FIG. 4A illustrates a block diagram of an input sampling network for a delta-sigma modulator, in accordance with embodiments of the present disclosure.

FIG. 4A illustrates a block diagram of an input sampling network 400a, in accordance with embodiments of the present disclosure. In some embodiments, input sampling network 400a may be utilized as input summer 301 and first stage 302a of delta-sigma modulator 300 of FIG. 3, although its utility is not limited thereto.

Input sampling network 400a generally operates in accordance with a clock signal CLK, the complement of which is a signal CLK'. Each of clock signals CLK and CLK' may comprise a square-wave signal, as shown in FIG. 4A. Clock signals CLK and CLK' may define clock cycles operating at a sampling rate wherein each clock cycle includes a first phase when clock signal CLK is high and clock signal CLK' is low and a second phase when clock signal CLK is low and clock signal CLK' is high. Each phase may further be broken down into a first period (which may also be referred to as a "rough" period) which is defined by a period of the phase in which a square-wave signal $CLK_R$ is high and a second period (which may also be referred to as a "fine" period) which is defined by a period of the phase in which a square-wave signal $CLK_F$ is high. Accordingly, during each phase, signals $CLK_R$ and $CLK_F$ may be complements of each other. In some embodiments, the first period may begin approximately at the beginning of each occurrence of the phase and may be substantially immediately followed by the second period which may end approximately at the end of each occurrence of the phase.

Generally, during the first period of the first phase of each cycle, switches 402, 408, and 422 close, and the feedback voltages $DAC^+$ and $DAC^-$ from feedback DAC 307 may be coupled to the input plates of sampling capacitors 410a and 410b, respectively, and thus will pre-charge such input plates to the voltages $DAC^+$ and $DAC^-$, respectively. During the second period of each first phase of each cycle, switches 402, 408, and 424 may be closed and charges proportional to the voltages $v^+$ and v– at the inputs to input sampling network 400a are respectively sampled onto cross-coupled sampling capacitors 410a and 410b, respectively. During the second phase of each cycle, switches 404 and 406 may close, and during the first (rough) period of the second phase, switch 422 may close, which pre-charges the sampling capacitors 410a and 410b. Then, during the second (fine) period of the second phase, switch 424 may close and the input voltages $v^+$ and v– are coupled to the input plates of sampling capacitors 410a and 410b, respectively. Consequently the charges sampled onto sampling capacitors 410a and 410b during the first phase and second phase are respectively forced onto integration capacitors 414a and 414b which are each coupled between inputs and outputs of integrator 412. Feedback voltages $DAC^+$ and $DAC^-$ may also be applied to the feedback capacitors 430a and 430b during each phase via switches 426 and 428, thus performing double sampling for the feedback voltage signals and the function of summer 301 in applying negative feedback of the $DAC^+$ and $DAC^-$ signals. As is shown in FIG. 4A, sampling capacitors 410a and 410b may have M times the capacitance of feedback capacitors 430a and 430b, wherein M represents a gain of the feedback signal to be applied in summer 301.

By pre-charging input plates of sampling capacitors 410a and 410b to the feedback voltages $DAC^+$ and $DAC^-$, the input plates will be charged to a voltage which should be close in magnitude to the next sample to be sampled onto sampling capacitors 410a and 410b during the second portion of the first phase, assuming that the differential signal represented by $v^+$ and $v^-$ is a continuous analog signal and assuming a high enough sampling rate. Accordingly, where an anti-aliasing filter or other analog front-end circuitry (not explicitly shown in FIG. 4A) is present driving the differential input signals $v^+$ and $v^-$, such pre-charging reduces the amount of charge flowing from such circuitry as compared to existing approaches, thus increasing the input impedance of input sampling network 400a as compared to other approaches.

Figure 5:
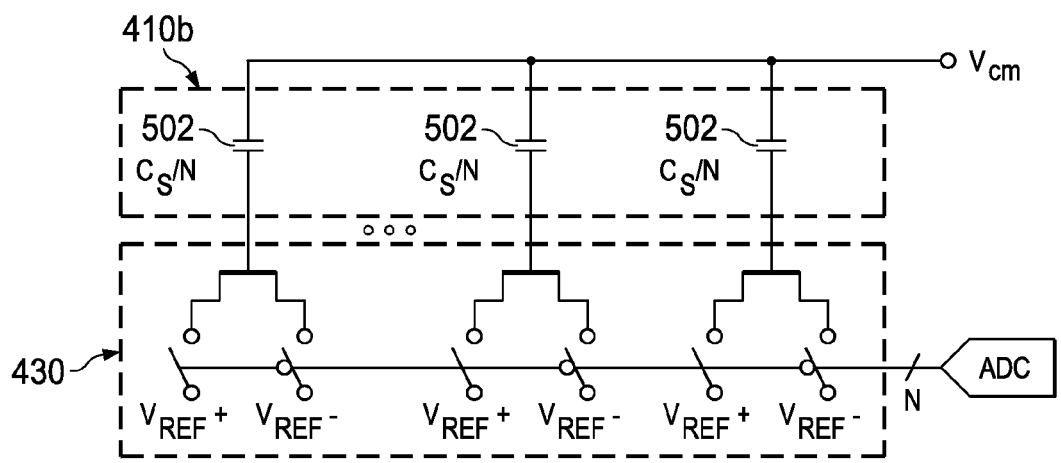
FIG. 5 illustrates an equivalent circuit diagram of selected portions of the input sampling network depicted in FIG. 4B, in accordance with embodiments of the present disclosure.
Figure 4B:
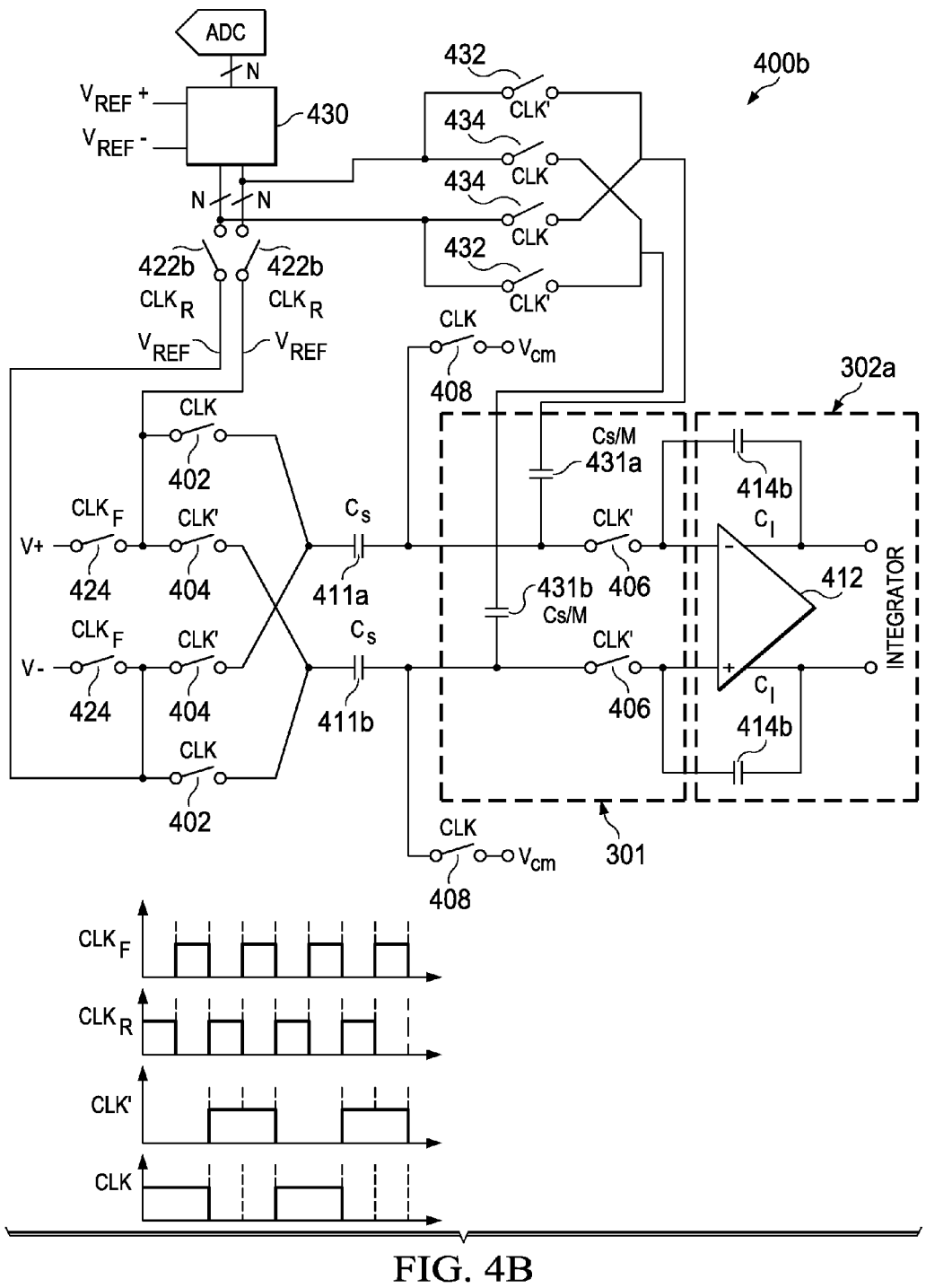
FIG. 4B illustrates a block diagram of another input sampling network for a delta-sigma modulator, in accordance with embodiments of the present disclosure.

FIG. 4B illustrates a block diagram of another input sampling network 400b, in accordance with embodiments of the present disclosure. In some embodiments, input sampling network 400b may be utilized as input summer 301 and first stage 302a of delta-sigma modulator 300 of FIG. 3, although its utility is not limited thereto. Input sampling network 400b is similar in structure and principle of operation as input sampling network 400a, the difference being that the N-bit analog-to-digital signal ADC generated by multiple-bit quantizer 305 is used as a feedback signal to pre-charge equivalent sampling capacitances 411a and 411b, and sampling capacitances 411a and 411b are each equivalent capacitors each comprising N physical capacitors 502 coupled to each other at their respective output plates (as shown in FIG. 5). Thus, as shown in FIG. 4B and also in FIG. 5 (which depicts an equivalent circuit diagram of selected portions of input sampling network 400b during the first portion of the first phase), during the first portion of the first phase, a conversion block 430 generates, based on N-bit signal ADC, an N-bit digital signal such that each of the N physical capacitors 502 of each of equivalent sampling capacitances 411a and 411b will be pre-charged to one of a positive polarity reference voltage $v_{REF}^+$ or a negative polarity reference voltage $v_{REF}^-$, such that when combined, each of the input of the equivalent sampling capacitances 411a and 411b will be pre-charged to a voltage based on the feedback signal ADC, which assuming that the differential signal represented by $v^+$ and $v^-$ is a continuous analog signal and assuming a high enough sampling rate, the inputs of the equivalent sampling capacitances 411a and 411b will be charged to voltages which should be close in magnitude to the next samples to be sampled onto such equivalent sampling capacitances 411a and 411b during the second portion of the first phase. Feedback voltages based on the feedback signal ADC may also be applied to equivalent feedback capacitors 411a and 411b during each phase via switches 432 and 434, thus performing double sampling for the feedback voltage signals, and the function of summer 301 in applying negative feedback of the ADC signal. Although not explicitly shown in the FIGURES, each equivalent feedback capacitor 411a and 411b shown in FIG. 4B may have function and/or structure similar to that of equivalent sampling capacitor 411 shown in FIG. 5. As is shown in FIG. 4A, sampling capacitors 431a and 431b may have M times the capacitance of feedback capacitors 411a and 411b, wherein M represents a gain of the feedback signal to be applied in summer 301.

Figure 1:
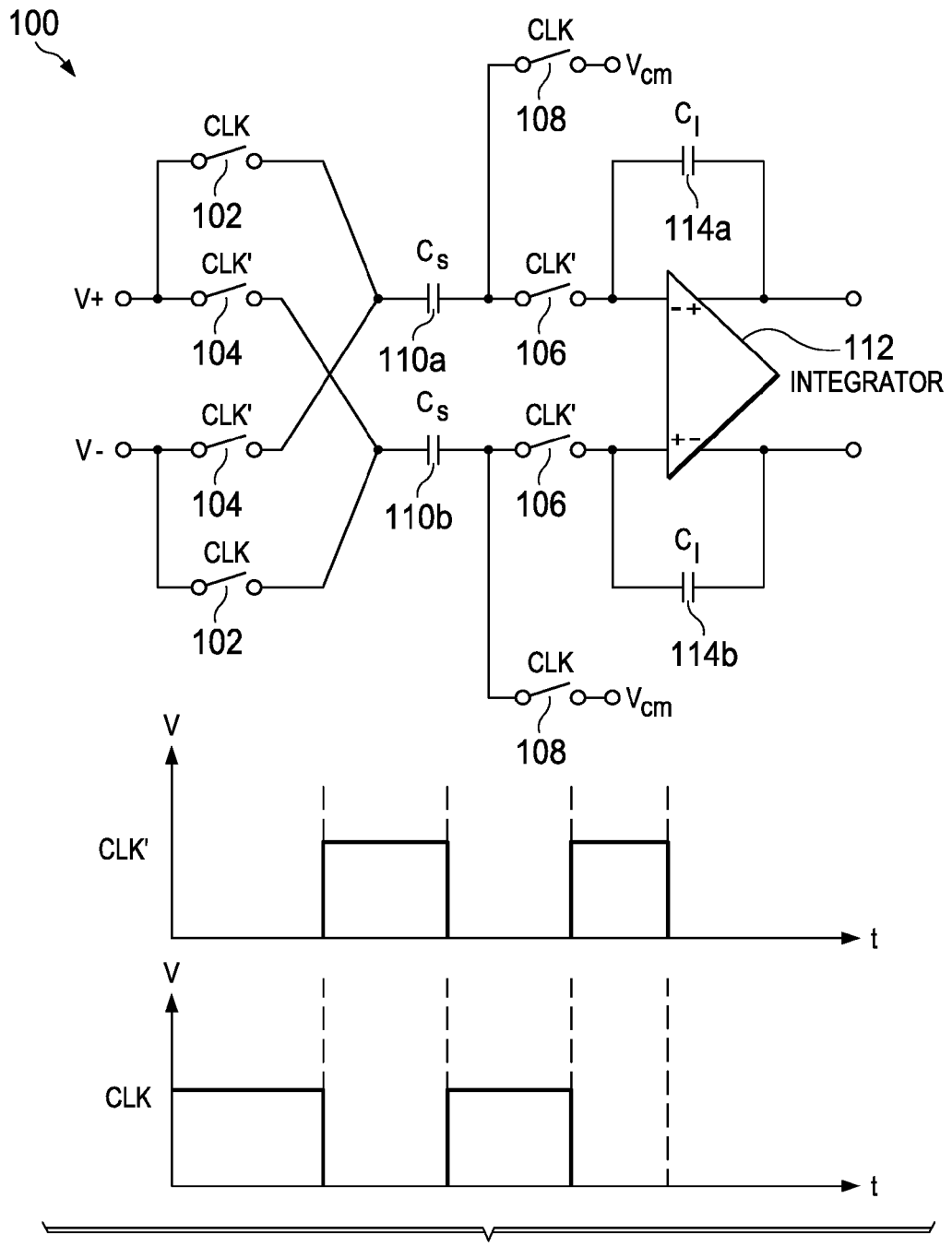
FIG. 1 illustrates a block diagram of an input sampling network for a delta-sigma modulator, as is known in the art.

The input networks described in FIGS. 4A, 4B, and 5 may possess many advantages over previous approaches to increasing input impedance of input networks for delta-sigma modulators. For example, as compared to solutions in which buffers are used to pre-charge sampling capacitor, the input networks described in FIGS. 4A, 4B, and 5 would typically require less complex design effort. As another example, the input networks described in FIGS. 4A, 4B, and 5 may increase effective input impedance to orders of magnitude much higher than the doubling of effective input impedance in solutions in which sampling capacitor are discharged to a common-mode voltage equal to $(v^+ + v^-)/2$. In addition, input networks described in FIGS. 4A, 4B, and 5 do not require any appreciable increase in power consumption as compared to the prior art input sampling network described with respect to FIG. 1.

As used herein, when two or more elements are referred to as "coupled" to one another, such term indicates that such two or more elements are in electronic communication whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An input network for a delta-sigma modulator having at least one integrator stage and a feedback digital-to-analog stage, the input network comprising a sampling capacitor, and wherein the input network:
   during a first period of a first phase of a clock signal, drives an analog feedback signal proportional to a digital feedback signal of the feedback digital-to-analog stage onto an input plate of the sampling capacitor; and
   during a second period of the first phase of the clock signal, samples an analog input signal onto the input plate of the sampling capacitor.

2. The input network of claim 1, wherein:
   the input network further comprises a second sampling capacitor;
   the analog feedback signal is an analog differential signal;
   the analog input signal is an analog differential input signal;
   during the first period of the first phase of a clock signal, the input network drives the analog differential feedback signal onto the input plate of the sampling capacitor and an input plate of a second sampling capacitor, such that a positive polarity of the analog differential feedback signal is driven to the sampling capacitor and a negative polarity of the analog differential feedback signal is driven to the second sampling capacitor; and
   during the second period of the first phase of the clock signal, the input network samples the analog differential input signal onto the input plate of the sampling capacitor and the input plate of the second sampling capacitor such that a positive polarity of the analog differential input signal is sampled on the sampling capacitor and a negative polarity of the analog differential input signal is sampled on the second sampling capacitor.

3. The input network of claim 2, wherein:
   during a first period of a second phase of the clock signal, the input network drives a complement of the analog differential feedback signal onto the input plate of the sampling capacitor and the input plate of the second sampling capacitor, such that the negative polarity of the analog differential feedback signal is driven to the sampling capacitor and the positive polarity of the analog differential feedback signal is driven to the second sampling capacitor; and
   during a second period of the second phase of the clock signal, the input network samples a complement of the analog differential input signal onto the input plate of the sampling capacitor and the input plate of the second sampling capacitor such that the negative polarity of the analog differential input signal is sampled on the sampling capacitor and the positive polarity of the analog differential input signal is sampled on the second sampling capacitor.

4. The input network of claim 1, wherein the input network further charge transfers the analog input signal from the sampling capacitor to an input of the delta-sigma modulator during a second phase of the clock signal.

5. The input network of claim 1, wherein:
   the sampling capacitor is an equivalent capacitor comprising one or more physical capacitors coupled to each other at their respective output plates and configured such that during the first portion of the sampling phase of the clock signal, the input network drives a respective voltage onto an input plate of each of the one or more parallel physical capacitors such that the one or more physical capacitors are equivalent to a single capacitor being driven by the analog feedback signal during the first portion of the first phase of the clock signal.

6. The input network of claim 5, wherein each of the one or more physical capacitors are configured to be selectively coupled to either of a positive polarity of a reference voltage or a negative polarity of the reference voltage based on the digital feedback signal such that the one or more physical capacitors are equivalent to a single capacitor being driven by the analog feedback signal during the first portion of the first phase of the clock signal.

7. A method comprising:
   during a first period of a first phase of a clock signal, driving an analog feedback signal proportional to a digital feedback signal of a feedback digital-to-analog stage of a delta-sigma converter onto an input plate of the sampling capacitor, wherein the sampling capacitor is integral to an input sampling network for the delta-sigma converter; and
   during a second period of the first phase of the clock signal, sampling an analog input signal onto the input plate of the sampling capacitor.

8. The method of claim 7, wherein the analog feedback signal is an analog differential signal and the analog input signal is an analog differential input signal, and the method further comprises:
   during the first period of the first phase of a clock signal, driving the analog differential feedback signal onto the input plate of the sampling capacitor and an input plate of a second sampling capacitor integral to the input sampling network, such that a positive polarity of the analog differential feedback signal is driven to the sampling capacitor and a negative polarity of the analog differential feedback signal is driven to the second sampling capacitor; and
   during the second period of the first phase of the clock signal, sampling the analog differential input signal onto the input plate of the sampling capacitor and the input plate of the second sampling capacitor such that a positive polarity of the analog differential input signal is sampled on the sampling capacitor and a negative polarity of the analog differential input signal is sampled on the second sampling capacitor.

9. The method of claim 8, further comprising:
   during a first period of a second phase of the clock signal, driving a complement of the analog differential feedback signal onto the input plate of the sampling capacitor and the input plate of the second sampling capacitor, such that the negative polarity of the analog differential feedback signal is driven to the sampling capacitor and the positive polarity of the analog differential feedback signal is driven to the second sampling capacitor; and during a second period of the second phase of the clock signal, sampling a complement of the analog differential input signal onto the input plate of the sampling capacitor and the input plate of the second sampling capacitor such that the negative polarity of the analog differential input signal is sampled on the sampling capacitor and the positive polarity of the analog differential input signal is sampled on the second sampling capacitor.

10. The method of claim 7, wherein the input network further charge transfers the analog input signal from the sampling capacitor to an input of the delta-sigma modulator during a second phase of the clock signal.

11. The method of claim 7, wherein:
the sampling capacitor is an equivalent capacitor comprising one or more physical capacitors coupled to each other at their respective output plates and configured such that during the first portion of the sampling phase of the clock signal, the input network drives a respective voltage onto an input plate of each of the one or more parallel physical capacitors such that the one or more physical capacitors are equivalent to a single capacitor being driven by the analog feedback signal during the first portion of the first phase of the clock signal.

12. The method of claim 11, wherein each of the one or more physical capacitors are configured to be selectively coupled to either of a positive polarity of a reference voltage or a negative polarity of the reference voltage based on the digital feedback signal such that the one or more physical capacitors are equivalent to a single capacitor being driven by the analog feedback signal during the first portion of the first phase of the clock signal.

\* \* \* \* \*